United States Patent [19]

Dederer

[11] Patent Number: 5,005,455
[45] Date of Patent: Apr. 9, 1991

[54] METHOD AND APPARATUS FOR MANUFACTURING PREFORM PANELS WITH PREFORMS FOR REPAIRING INTERCONNECTS

[75] Inventor: Guenter Dederer, Munich, Fed. Rep. of Germany

[73] Assignee: Siemens Aktiengesellschaft, Berlin and Munich, Fed. Rep. of Germany

[21] Appl. No.: 327,909

[22] Filed: Mar. 23, 1989

[30] Foreign Application Priority Data

May 26, 1988 [DE] Fed. Rep. of Germany ....... 3817901

[51] Int. Cl.$^5$ .................... B21D 28/10; H05K 3/24
[52] U.S. Cl. ............................... 83/50; 83/55; 83/140; 83/207; 83/238; 83/278
[58] Field of Search ................... 83/50, 206, 207, 234, 83/238, 282, 217, 214, 278, 55, 129, 133, 138, 140, 468.1, 466.1, 405, 409, 419, 730

[56] References Cited

U.S. PATENT DOCUMENTS

| 776,511 | 12/1904 | Hall | 83/140 |
|---|---|---|---|
| 2,378,603 | 6/1945 | Wales | 83/140 X |
| 2,410,372 | 10/1946 | Wales | 83/50 X |
| 3,252,365 | 5/1966 | Hardy | 83/217 |
| 3,254,550 | 6/1966 | McDonald | 83/140 X |
| 3,599,520 | 8/1971 | Wood | 83/55 X |
| 3,715,943 | 2/1973 | Hirai et al. | 83/50 |
| 3,848,495 | 11/1974 | Youra | 83/278 X |
| 3,908,980 | 9/1975 | Fowler | 83/419 X |
| 3,961,512 | 6/1976 | Mentis | 83/405 X |
| 4,144,783 | 3/1979 | Yamazaki et al. | 83/55 X |
| 4,519,284 | 5/1985 | Hunter et al. | 83/405 X |
| 4,697,485 | 10/1987 | Raney | 83/50 X |
| 4,787,282 | 11/1988 | Okachi et al. | 83/405 X |
| 4,789,089 | 12/1988 | Toyota | 227/15 |
| 4,817,477 | 4/1989 | Emery et al. | 83/55 X |

FOREIGN PATENT DOCUMENTS

| 0043586A3 | 1/1982 | European Pat. Off. . |
| 2251997C3 | 5/1974 | Fed. Rep. of Germany . |
| 2739077A1 | 3/1978 | Fed. Rep. of Germany . |
| 3025875A1 | 2/1982 | Fed. Rep. of Germany . |

OTHER PUBLICATIONS

"Open Conductor Repair for Glass Metal Module" by F. M. Tappen, IBM Technical Disclosure Bulletin, vol. 14, No. 10, Mar. 1972, p. 2915.

Primary Examiner—Douglas D. Watts
Assistant Examiner—Rinaldi Rada
Attorney, Agent, or Firm—Hill, Van Santen, Steadman & Simpson

[57] ABSTRACT

A method and apparatus for manufacturing preform panels having at least one preform for repairing interconnects, particularly for repairing meander-like interconnects with a preform plated with hard solder. The metal has at least the steps of: providing at least two successive punch events with a die; and performing a predetermined feed (V) between a metal band and the die between the two punch events, whereby the length of the feed (V) is greater than a die width of the die, a length of the die being shorter than a width of the metal band, and the preform being formed by a residual web of the metal band after the two successive punch events. The apparatus for manufacturing preform panels having at least one preform from a metal band has at best: a receptacle plate on a carriage for the acceptance of the metal band; a die with a means for hold-down; a motor for generating a predetermined feed between the die and the metal band; at least two positioning pins for positioning the metal band on the receptacle plate; and a die-plate that cooperates with the die that is perpendicularly movable up and down and with its hold-down means.

9 Claims, 1 Drawing Sheet

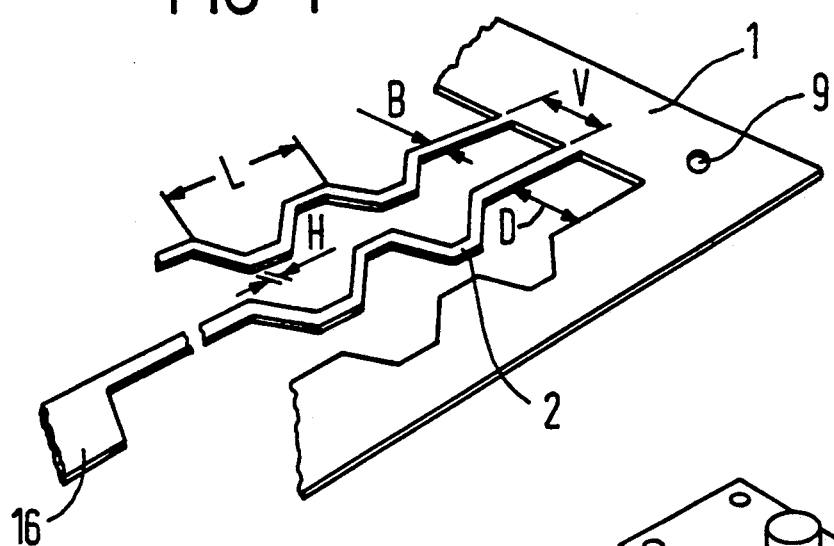
FIG 1
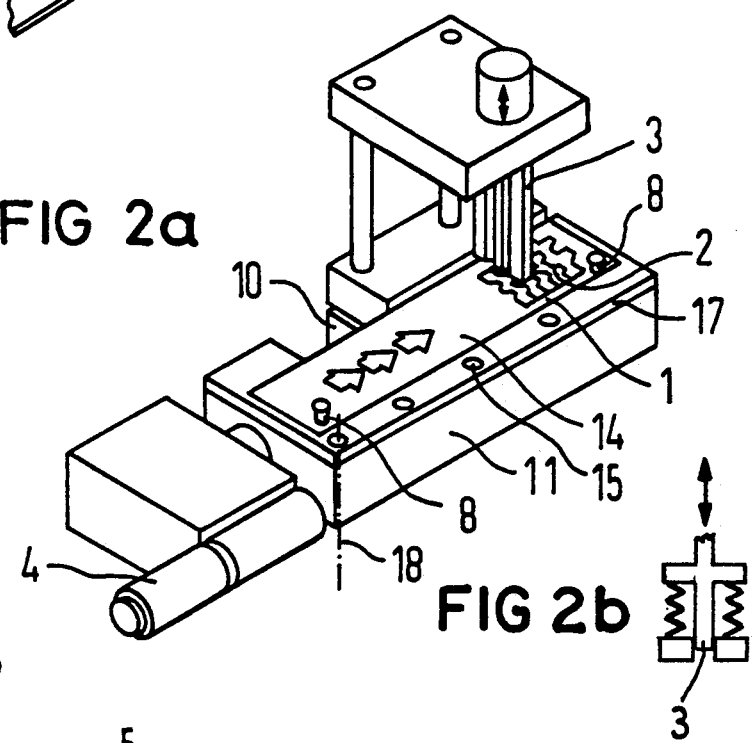
FIG 2a
FIG 2b
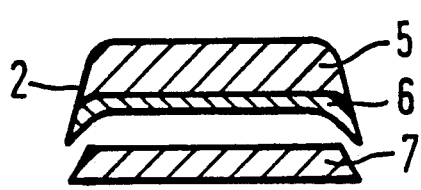
FIG 3
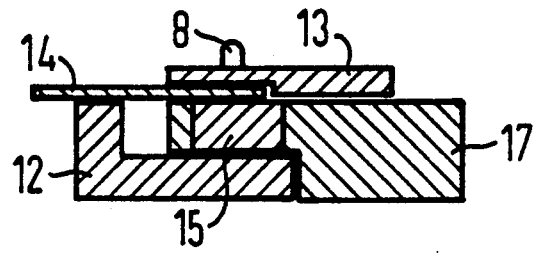
FIG 4

METHOD AND APPARATUS FOR MANUFACTURING PREFORM PANELS WITH PREFORMS FOR REPAIRING INTERCONNECTS

BACKGROUND OF THE INVENTION

The present invention is directed to a method for manufacturing preform panels having at least one preform for repairing meander-like, trapezoidal interconnect tracks with preforms plated with hard solder whose width lies in the range from, for example, 50 through 70 μm. Preforms on this order of magnitude usually have an overall thickness of about 20 through 30 μm.

The repair of interconnects is carried out with preforms that are congruent with the interconnect interruption. Preform panels are manufactured for simplifying the repair procedure, a plurality of preforms having all possible configurations of an interconnect being contained in these preform panels. Such a preform is selected for its congruency and is punched from the preform panel in correspondingly symmetrical fashion relative to the interruption. The subsequent repair occurs in a further, independent process.

German Patent 22 51 997 discloses a method that is essentially directed to the material properties of a fine band and the coating thereof with hard soldering for repair of the interconnect. The interconnects under consideration here have a width between 100 and 150 μm and a height of about 50 μm. The critical difference compared to the interconnect generation that must now be manipulated is in the halving of the interconnect width and in the design thereof in the form of meander-like structures. Punching methods that were previously known and that are based on a positive punching principle, i.e. whose dies have the same width and contour of the preform to be punched, encounter their limits for the dimensioning set forth herein, whereby the one die, for example, would have to have a width of 60 μm. Such dies are inadequate to meet the stresses when punching cover bands or cover bands plated with hard solder and are subject to breaking.

SUMMARY OF THE INVENTION

An object of the present invention is to provide a method for manufacturing a preform panel having a plurality of preforms, whereby the preform panel exhibits good stability for further manipulation.

The method and apparatus of the present invention is for manufacturing preform panels having at least one preform for repairing interconnects, particularly for repairing meander-like interconnects with a preform plated with hard solder. The method is characterized by at least two successive punch events with a die; and a prescribable feed (V) between a metal band and the die between two punch events, whereby the length of the feed (V) is greater than the die width, the length of the die is shorter than the width of the metal band, and the preform is formed by the residual web. Further at least one additional feed (V) is provided without a punch event for reinforcing the preform panel by forming a broad residual web. At least one interconnect configuration is contained within the overall length of the preform. The ends of the preform within the preform panel are fashioned as connections for terminal eyelets.

The apparatus for the implementation of the method is characterized by a receptacle plate on a carriage for the acceptance of the metal band; a die with hold-down means; a motor for generating a prescribable feed between the die and the metal band; at least two positioning pins for positioning the metal band on the receptacle plate; and a die-plate that cooperates with the die that is perpendicularly movable up and down and with its hold-down means. A clamp mechanism for the metal band is held against the receptacle plate by permanent magnets. The clamp mechanism is composed of at least one auxiliary plate for placing the metal band on the receptacle plate; and at least one clamp plate for locking the metal band on the receptacle place. The receptacle place on the carriage is pivotable via a rotational axis for the insertion event of the metal band.

The present invention is based on the perception that the required, miniaturized preforms can be produced within a preform panel only with a stamping or punching method that is based on the principle of negative punching. This is a procedure that causes a prescribable division feed in two successive punching events with a punch that exactly corresponds to the sum of die width and preform width. A preform corresponding to the die geometry is thus not punched out. On the contrary, the residual web that remains is employed, this receiving the desired shape due to the two-sided contours of the punch. Since a metal band is used as initial material and the length of the punch is less than the width of the metal band, a frame of the metal band is preserved at the edge that lends the preform panel its stability.

By insertion of return strokes at defined locations, the stability of the preform panel can be further enhanced by the broader residual webs thus achieved.

An especially advantageous exploitation of the metal band derives by designing the punch in such a form that a plurality of interconnect configurations, for example differently shaped meanders, are contained within the entire length of a preform.

For repairing interconnects in the proximity of terminal eyelets, it is advantageous to already provide these connections at terminal eyelets in the preform panel. For reasons of stability, this expediently occurs in such form that these connections for terminal eyelets form the ends of the preform that join to the stable, outer frame of the preform panel.

The seating and locking of the metal band for manufacturing a preform panel can occur in a way simple for manipulation by use of permanent magnets in combination with auxiliary and clamp plates.

For simple manipulation, the receptacle plate can also be swivelled out and around a rotational axis that is expediently perpendicular.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 is a partial perspective view of a preform panel 1 comprising preforms 2;

FIG. 2a is a perspective view of an apparatus for the implementation of the methods of the present invention;

FIG. 2b depicts a hold-down means used in the FIG. 2a device;

FIG. 3 depicts a cross section through an interconnect and shows a preform positioned thereabove; and FIG. 4 depicts a cross section of a special design of a mount for a metal band within the apparatus for the implementation of the method of the present invention.

DESCRIPTION OF THE PREFERRED EMBODIMENT

FIG. 1 shows a portion of a preform panel 1 that is fabricated with the method of the present invention and with the corresponding apparatus. This contains a part of the surrounding stable frame that has positioning holes 9 and surrounds a plurality of preforms 2. In accordance with the die width D, the parts punched out during the punching process leave regions between which the residual webs are preforms 2.

For example, these preforms in one embodiment have the following dimensioning: width B about 60 $\mu$m, height H about 25 $\mu$m, and length L, an interconnect configuration of about 1.5 mm. In this case, the length of the interconnect configuration represents a periodic image pattern, whereby various interconnect configurations can appear within an overall length of a preform. The die width D, for example, is 540 $\mu$m, a feed V of 540 $\mu$m + 60 $\mu$m = 600 $\mu$m resulting therefrom. A connection for a terminal eyelet 16 is indicated in FIG. 1, this being expediently placed at the transition of a residual web to the surrounding frame.

Repair parts having a width of 50 $\mu$m through 70 $\mu$m as required can be manufactured with the negative punching method that removes parts corresponding to the punch width D and leaves residual webs, the preforms 2, behind. The overall punch length of the preforms in this case is designed for 6.4 mm and is dependent on the periodic return of the interconnect configuration. The die clearance for a bur-free cut for a 20 $\mu$m thick copper foil amounts to between 0 and 2 $\mu$m. The stability of a preform panel is established, first, by the surrounding frame and is additionally enhanced by one or more broad residual webs. Such residual webs, for example, are usually realized by three steps following 34 steps.

FIG. 2a shows an apparatus for the implementation of the method of the present invention. A metal band 14 is placed onto a receptacle plate 17 of a carriage 11 that is driven by a motor 4 in steps. The metal band 14 is locked by positioning pins 8 that engage positioning holes 9. The feed direction of the carriage 11 together with the metal band 14 is indicated by the large arrows shown in FIG. 2a. The stroke motions of the die 3 are likewise illustrated with a double arrow. The die 3 interacts with a die-plate 10. A hold-down means is provided for clamping the residual web that is additionally necessary for the punching operation and is shown FIG. 2a. As a result of the matching of die width D and feed V that has already been set forth, the preforms 2 are manufactured with the corresponding width B in the form of residual webs. The surrounding frame of the preform panel 1 may be clearly seen in FIG. 2, resulting in the length of the die 3 being less than the overall width of the metal band 14.

FIG. 3 shows a section through a interconnect 7 over which a corresponding preform 2 for repair is shown. The preform 2 is composed of a carrier, of the metal band 5, and of a hard solder plating 6. The burrs that arise on both sides due to the punching operation are shown in FIG. 3. The length of such a preform 2 is selected from various configurations in a residual web with respect to further-processing. A preform 2 separated from a preform panel is congruent with the interconnect configuration and optimally symmetrical, overlapping the interconnection interruption at both sides for the joining process.

FIG. 4 shows an advantageous development of the apparatus shown in FIG. 2a for the implementation of the method of the present invention. The errors in the locking of a metal band 14 that are always present due to tolerances between positioning holes 9 and positioning pins 8 can be avoided by the utilization of an auxiliary plate 12 and of a clamp plate 13. The insertion and the locking of the metal band 14 on the carriage 11 occurs in such form that the auxiliary plate 12, a type of supporting plate, is first attached to a corresponding formed portion of the carriage 11. The holding occurs with one or more permanent magnets 15 located in the carriage 11 and by the corresponding, magnetic attachment of the auxiliary plate 12. Following thereupon, the metal band 14 is placed onto the positioning pins 8 present on the carriage 11. After the clamp plate 13 has been put in place and hooked onto the pin 8, the auxiliary plate 12 can be removed in a downward direction. The clamp plate 13 is likewise held by the permanent magnets 15 in the carriage 11.

It is expedient for placing the metal band 14 into the feed means to design the receptacle plate 17 on the carriage 11 to be pivotable about a rotational axis 18. This rotational axis is positioned perpendicularly and is expediently placed outside of the seating surface of the metal band 14, as indicated in FIG. 2a.

The motor 4 is designed as a stepping motor. The steps having the feed V are prescribed via a stepping motor control.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for manufacturing preform panels having at least one preform for repairing interconnects with a preform plated with hard solder, comprising the steps of:

providing at least two successive punch events on a metal band with a die; and performing a predetermined feed (V) of the metal band relative to the die between the two punch events, whereby the length of the feed (V) is greater than a die width of the die, a length of the die being shorter than a width of the metal band, and the preform being formed by a residual web of the metal band after the two successive punch events.

2. The method according to claim 1, wherein the method further comprises the step of providing at least one additional feed (V) between the two successive punch events for reinforcing the preform panel by forming a broad residual web.

3. The method according to claim 1, wherein at least one interconnect configuration is contained within an overall length of the preform.

4. The method according to claim 1, wherein ends of the preform within the preform panel are fashioned as connections for terminal eyelets.

5. A method for manufacturing preform panels having at least one preform for repairing interconnects with a preform plated with hard solder, comprising the steps of:
providing at least two successive punch events on a metal band with a die;
performing a predetermined feed (V) of the metal band relative to the die between the two punch events, whereby the length of the feed (V) is greater than a die width of the die, a length of the die being shorter than a width of the metal band, and the preform being formed by a residual web of the metal band after the two successive punch events; and
providing at least one additional feed (V) between the two successive punch events for reinforcing the preform panel by forming a broad residual web.

6. The method according to claim 5, wherein at least one interconnect configuration is contained within an overall length of the preform.

7. The method according to claim 5, wherein ends of the preform within the preform panel are fashioned as connections for terminal eyelets.

8. An apparatus for manufacturing preform panels having at least one preform from a metal band comprising:
a receptacle plate on a carriage for the acceptance of the metal band;
a die with a means for hold-down of the metal band when the die punches the metal band;
a motor for generating a predetermined feed between the die and the metal band;
at least two positioning pins for positioning the metal band on the receptacle plate;
a die-plate that cooperates with the die, the die with the means for hold-down being perpendicularly movable up and down;
a clamp mechanism for the metal band held against the receptacle plate by permanent magnets, said clamp mechanism being composed of:
at least one permanent magnet attached to the receptacle plate;
at least one auxiliary plate for supporting at least a first portion of the metal band, the auxiliary plate held to the receptacle plate by the permanent magnet; and
at least one clamp plate for locking the metal band on the receptacle plate, said clamp plate being at least partially located over at least a second portion of the metal band and the permanent magnet being located under the second portion of the metal band.

9. The apparatus according to claim 8, wherein the receptacle plate on the carriage is pivotable via a rotational axis for an insertion event of the metal band.

* * * * *